United States Patent [19]
Steinlechner

[11] Patent Number: 6,041,336
[45] Date of Patent: Mar. 21, 2000

[54] CIRCUIT ARRANGEMENT FOR ARITHMETIC COMBINATION OF AN ANALOG SIGNAL WITH A DIGITAL VALUE AND METHOD AND CIRCUIT ARRANGEMENT FOR DETERMINATION OF AN ANGLE

[75] Inventor: Siegbert Steinlechner, Leonberg, Germany

[73] Assignee: Robert Bosch GmbH, Stuttgart, Germany

[21] Appl. No.: 09/296,729

[22] Filed: Apr. 22, 1999

[30] Foreign Application Priority Data

Apr. 29, 1998 [DE] Germany ............................ 198 19 069

[51] Int. Cl.$^7$ ................................. G06J 1/00; G06F 7/38
[52] U.S. Cl. .................................................. 708/4; 708/440
[58] Field of Search .................................. 708/4, 7, 276, 708/440

[56] References Cited

U.S. PATENT DOCUMENTS

| | | | |
|---|---|---|---|
| 3,813,528 | 5/1974 | Blanding | 708/440 |
| 3,896,299 | 7/1975 | Rhodes | 708/440 |
| 3,956,623 | 5/1976 | Clark et al. | 708/440 |
| 4,149,260 | 4/1979 | Loper, Jr. | 708/4 |
| 4,410,953 | 10/1983 | Barker | 708/4 |
| 5,880,586 | 3/1999 | Dukart et al. | 324/207.2 |

FOREIGN PATENT DOCUMENTS

| | | |
|---|---|---|
| 195 43 562 | 5/1996 | Germany . |
| 2 242 583A | 10/1991 | United Kingdom . |

*Primary Examiner*—Tan V. Mai
*Attorney, Agent, or Firm*—Michael J. Striker

[57] ABSTRACT

The circuit arrangement for determining an angle ($\alpha$) from analog signals (C,S) proportional to the sine and cosine of the angle ($\alpha$) to be determined includes a circuit device for multiplying an analog signal (S) with a digital value (Cs) for obtaining a first product value (S*Cs), the digital value (Cs) being proportional to the cosine of an estimated angle value ($\alpha_s$) for the angle ($\alpha$) to be determined;

a circuit device for multiplying another analog signal (C) with another digital value (Ss) to obtain a second product value (C*Ss), the another digital value (Ss) being proportional to the sine of the estimated angle value ($\alpha_s$) for the angle ($\alpha$) to be determined;

a circuit device for adding the first and second product values (S*Cs; C*Ss) to obtain a sum value (Su);

a circuit device for equalizing proportionality factors of the one and/or the other digital value (Ss; Cs) so that the sum value (Su) formed is proportional to sin ($\alpha-\alpha_s$); and a circuit device for adjusting the sum value (Su) to zero so that the estimated angle value ($\alpha_s$) corresponds to the angle ($\alpha$) to be determined.

14 Claims, 4 Drawing Sheets

CIRCUIT ARRANGEMENT FOR ARITHMETIC COMBINATION OF AN ANALOG SIGNAL WITH A DIGITAL VALUE AND METHOD AND CIRCUIT ARRANGEMENT FOR DETERMINATION OF AN ANGLE

BACKGROUND OF THE INVENTION

1. Field of the Invention

The present invention relates to a circuit arrangement for arithmetic combination of an analog signal, especially a voltage signal, with a digital value, as well as a method and a circuit arrangement for determining an angle from respective analog signals proportional to the sine and cosine of the angle.

2. Prior Art

Numerous technical applications require the multiplication of an analog signal with a value present in digital form for further processing.

For example, in one application, two analog electrical parameters, which correspond to the sine and cosine of an angle, are used to determine an angle. This sort of problem occurs, for example, in radar engineering, interferometry or laser distance measurement. Also angle sensors, which measure the angle between the direction of a magnetic field and a sensor, for example by means of Hall effect or an anisotropic magneto-resistive effect, supply these type of signals. The determination of the angle from the corresponding analog sine or cosine values requires a multiplication with values, which are appropriately stored first in digital form, in the case of certain computational algorithms. Usually the digital signal or value would be converted to an analog value for performing this kind of multiplication, but that increases the circuitry expenses.

Circuits known for evaluation of measured values from Hall effect sensors or AMR sensors are known from German Patent Document DE-OS 195 43 562. For example, this published patent document suggests determination of an angle by evaluation of the sine and cosine values measured by means of two Hall sensors arranged displaced with respect to each other by means of a circuit device embodying the arctan function. The circuit device embodying the arctan function is comparatively expensive, since for example table interpolating methods or CORDIC algorithms must be consulted.

SUMMARY OF THE INVENTION

It is an object of the present invention to provide a circuit arrangement of the above-described type for arithmetic combination of an analog signal with a digital signal that has reduced circuitry expense in comparison to conventional circuit arrangements.

It is also an object of the present invention to provide an improved method and apparatus for determination of an angle from respective analog signals proportional to the sine and cosine of the angle.

According to the invention the circuit arrangement for arithmetic combination, especially multiplication, of analog signals C,S, especially analog voltage signals, with respective digital values Ss, Cs comprises controllable sign reversing means for switching the respective analog signals with changed or unchanged sign according to controlling sigma-delta modulators, to which the respective digital values Ss, Cs are input and by means of which the output signals, which can be +1 or −1, are changeable according to the digital values Ss,Cs. The output signals are input to the control inputs of the respective sign reversing means in such a manner that a value +1 causes a switching of the respective analog signal C,S with unchanged sign and a value −1 causes a switching of the respective analog signal C,S with changed sign or vice versa, so that the time average values of the output signals of the sign reversing means correspond to the desired arithmetic combination, especially a multiplication, of the analog signal C and the digital value Ss and the analog signal S and the digital value Cs respectively.

The method according to the invention for determining an angle $\alpha$ from respective analog signals S, C, especially voltage signals, proportional to the sine and cosine of the angle $\alpha$, includes the following steps:

a) multiplying one analog signal S with a digital value Cs to obtain a first product value S*Cs, the digital value Cs being proportional to the cosine of an estimated angle value $\alpha_s$ for the angle $\alpha$ to be determined;

b) multiplying another analog signal C with a digital value Ss to obtain a second product value C*Ss, Ss being proportional to the sine of the estimated angle value $\alpha_s$ of the angle $\alpha$ to be determined;

c) adding the first and second product values S*Cs and C*Ss to obtain a sum value Su;

d) equalizing proportionality factors for the digital values Ss and/or Cs so that the sum value Su formed is proportional to $\sin(\alpha - \alpha_s)$; and e) adjusting the sum value Su to zero or the null value so that the estimated angle value as corresponds to the angle $\alpha$ to be determined.

The arrangement for determining an angle $\alpha$ according to the invention from respective analog signals C,S, especially voltage signals, proportional to the sine and cosine of the angle $\alpha$, comprises means for multiplying one analog signal S with a digital value Cs to obtain a first product value S*Cs, the Cs being proportional to the cosine of an estimated angle value $\alpha_s$ for the angle $\alpha$ to be determined;

means for multiplying another analog signal C with a digital value Ss to obtain a second product value C*Ss, the Ss being proportional to the sine of the estimated angle value $\alpha_s$ for the angle $\alpha$ to be determined;

means for adding the first and second product values S*Cs; C*Ss to obtain a sum value Su;

means for equalizing proportionality factors for the digital value Ss and/or Cs so that the sum value Su formed is proportional to $\sin(\alpha - \alpha_s)$; and means for adjusting the sum value Su to zero or the null value so that the estimated angle value $\alpha_s$ corresponds to the angle $\alpha$ to be determined.

According to the invention multiplication of an analog signal value and a digital signal value may now be performed in a very simple manner. The determination of an angle from the sine and cosine values present in analog form is now possible with reduced circuitry expense and/or computational effort. The use of analog sign or peak reversing elements or devices, which, for example, can made in CMOS technology, is accomplished with reduced spatial requirements. High scan rates are possible without much expense, while in current conventional methods they can be attained only with a comparatively large expense, for example by providing a CORDIC coprocessor. Digital equalization of several offsets and amplification can be performed in a simple way. Furthermore it is advantageous that the main part of the signal processing according to the invention is performed digitally, which is possible in an equalization-free and reproducible manner using no structures. Only a small part of the circuit arrangement is analog so that errors or inaccuracies (offset, drift, noise, temperature drift) associated with analog components can be largely avoided.

Additional advantageous features are set forth in the following description and dependent claims appended hereinbelow.

BRIEF DESCRIPTION OF THE DRAWING

The objects, features and advantages of the invention will now be illustrated in more detail with the aid of the following description of the preferred embodiments, with reference to the accompanying figures in which.

DESCRIPTION OF THE PREFERRED EMBODIMENTS

Figure 4:
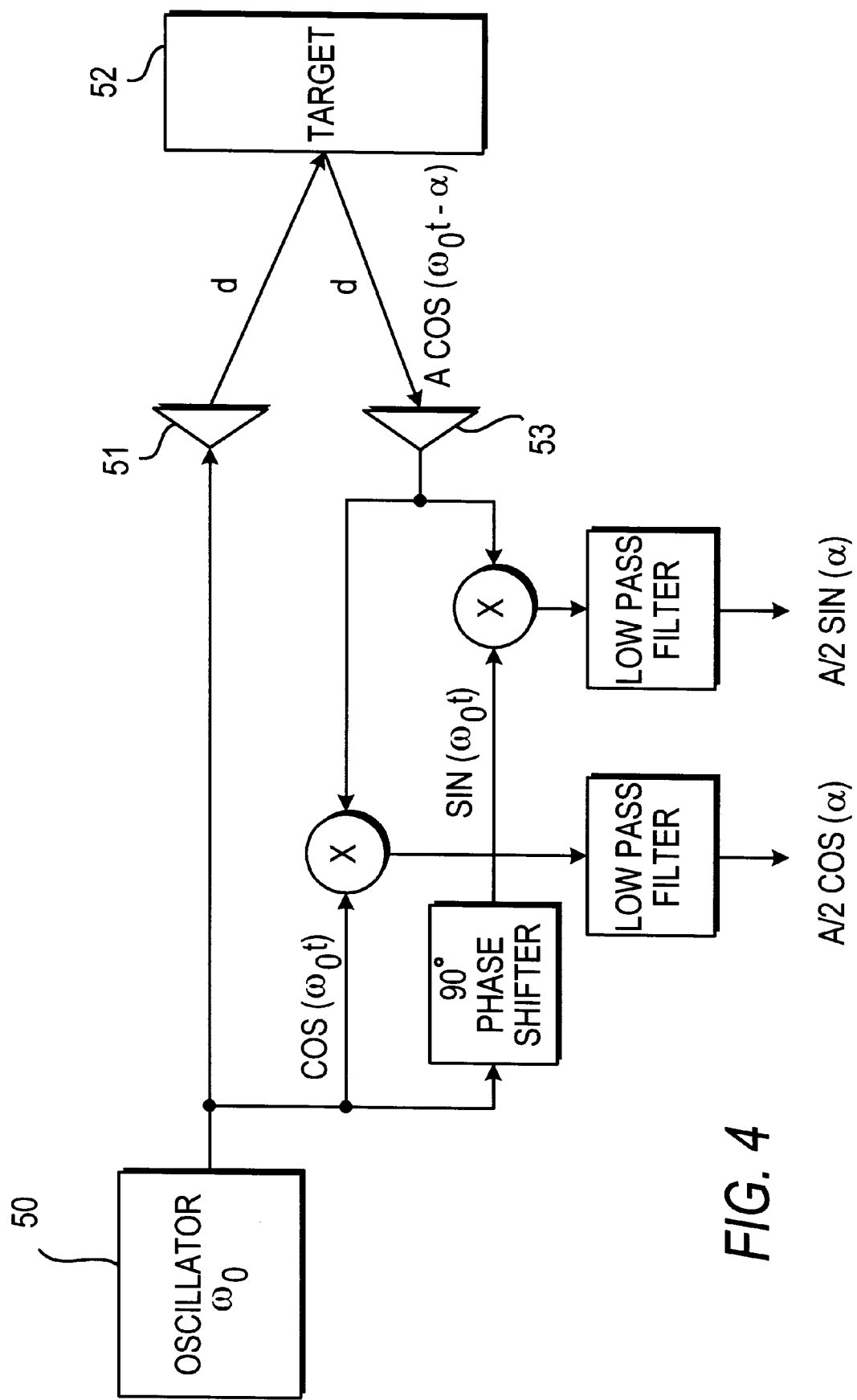
FIG. 4 is a block diagram of a prior art radar engineering device for determining an angle from the corresponding sine and cosine according to the state of the art.

FIG. 4 shows an example of a radar engineering device of the prior art for determining angle from the respective sine and cosine values.

An oscillator 50 with a frequency $\omega_o$ supplies a transmission antenna 51 with the signal $\cos(\omega_o t)$. The radar wave travels over path d to a target 52 and returns to a reception antenna 53 by means of reflection. The received signal $A^*\cos(\omega_o t - \alpha)$ rotated by phase angle $\alpha$ and attenuated by a factor A with respect to the transmitted signal is multiplied with the transmitted signal $\cos(\omega_o t)$ or with a signal $\sin(\omega_o t)$ rotated by about 90° and the resulting signals is passed through low pass filters or are low-pass filtered. The path or distance information $d=\alpha^*c/2/\omega_o$ is contained in the angle to be determined. corresponding spacing laws and input information occur in laser distance measurement, interferometry or angle determination using Hall or AMR sensors.

Figure 1:
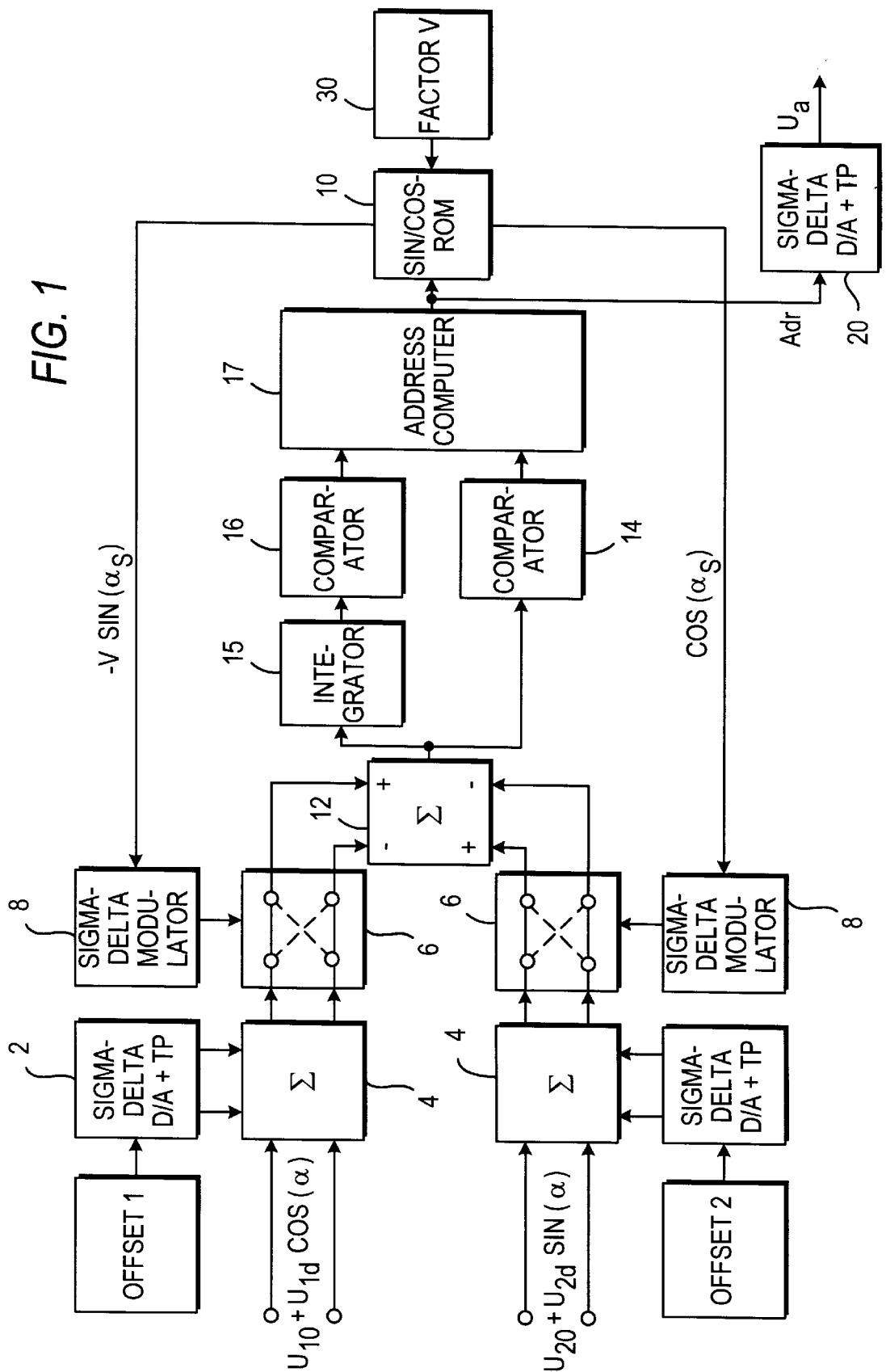
FIG. 1 is a block diagram of a preferred embodiment of the circuit arrangement for determining an angle according to the invention.

In FIG. 1 a circuit for angle determination is shown in the form of a block diagram, which performs the method according to the invention. An unshown sensor (e.g. radar sensor, interferometric sensor, AMR angle sensor or Hall sensor) supplies two analog voltage signals $C=U_{10}+U_{1d}*\cos(\alpha)$ and $S=U_{20}+U_{2d}*\sin(\alpha)$. It should be noted that non-ideal sensors have the offset voltages $U_{10}$ and $U_{20}$. In the case of an ideal sensor these offset voltages will take the value 0. The amplitudes $U_{1d}$ and $U_{2d}$ can be large but must not be equal.

Subsequently the offset voltages $U_{10}$ and $U_{20}$ are compensated or equalized. The digital signals, offset 1 and offset 2, which are adjustable so that they correspond to the offset values $U_{10}$ and $U_{20}$, are input to the respective high frequency (e.g. 4 MHz) sigma-delta modulators 2. Each of the sigma-delta modulators 2 produce a binary signal sequence or its complement at its output, which has the property that the average value of the signal sequence corresponds to the respective offset values $U_{10}$, $U_{20}$. After a low-pass filter TP direct current voltages corresponding to the offset values $U_{10}$ and $U_{20}$ are input into the summing or $\Sigma$ device 4 equipped with differential outputs and compensate the offset values $U_{10}$, $U_{20}$ of the analogous voltage signals in a suitable equalization.

The offset compensated voltage signals C,S are input respectively to respective controllable analog switch or sign reversing means 6. They can switch or pass the signals either with unchanged or with changed sign, i.e. reverse their sign. For changing the sign the (differential) signals cross outputs, as is illustrated by the dashed lines. Thus a multiplication of the signal with +1 or −1 is possible by passage of the signal through each element 6 with unchanged or changed sign.

The control of the respective sign reversing or switching means 6, i.e. the control, whether a sign change occurs or not, occurs by means of two digital high frequency sigma-delta modulators 8(pulse rate, e.g. 1 MHz). As input signals they receive the respective digital values $Ss=-v*\sin(\alpha_s)$ and $C_s=\cos(\alpha_s)$, for example as 16-bit words, from a ROM 10. The $\alpha_s$ is the estimated value for the angle $\alpha$ to be determined. This estimated angle value as is, $\alpha_s$ explained further hereinbelow, correlated with an address Adr in the ROM 10. The output signals of the sigma-delta modulators 8 are fed to the control inputs of the respective sign reversing means 6. They can only take the discrete values ±1. These output signals of the sigma-delta modulators represent the time average of the input signals to the sigma-delta modulators 8. When the analog signals applied to the sign reversing means 6 are transmitted unchanged in the presence of a signal +1 at the control input of the switch 6, and transmitted changed in the presence of a signal −1, they produce a multiplication of the analog signals C and S with the respective digital signal Ss and Cs.

After summation of the output product signals of the respective sign reversing means 6 in an adder 12 a sum signal, whose average sum value Su is proportional to $$U_{2d}*\sin(\alpha)*\cos(\alpha_s) - U_{1d}*\cos(\alpha)*v*\sin(\alpha_s)$$

is obtained.

The factor v is equalized (for example by means of a v-value storing component 30), so that $U_{2d}=v*U_{1d}$. The average value of the sum signal Su is given by equation (1):

$$\text{Su } U_{2d}*\{\sin(\alpha)*\cos(\alpha_s) - \cos(\alpha)*\sin(\alpha_s)\}. \tag{1}$$

To determine the angle a the average value of the sum value Su is controlled or adjusted until its value is 0 so that $\alpha=\alpha_s$. In order to perform this adjustment or control the sum value Su is input into a first comparator 14, which establishes the sign VZ1 of the sum signal. Furthermore the sum value Su integrated over a predetermined time interval by means of an integrator 15 is input to a second comparator 16, which establishes the sign VZ2 of the integral.

The signs VZ1, VZ2 established in this manner are fed to a digital address processor 17, which has e.g. a pulse rate of 1 MHz. The address processor 17 determines an integer address $Adr=\alpha_s/2/\pi*N$ in the ROM 10 acting as the sin/cos-ROM, which is assigned a new or modified estimated angle value $\alpha_s$. The N is the number of addresses or table entries per sine period, here in the illustrated embodiment for example 512.

Figure 2:
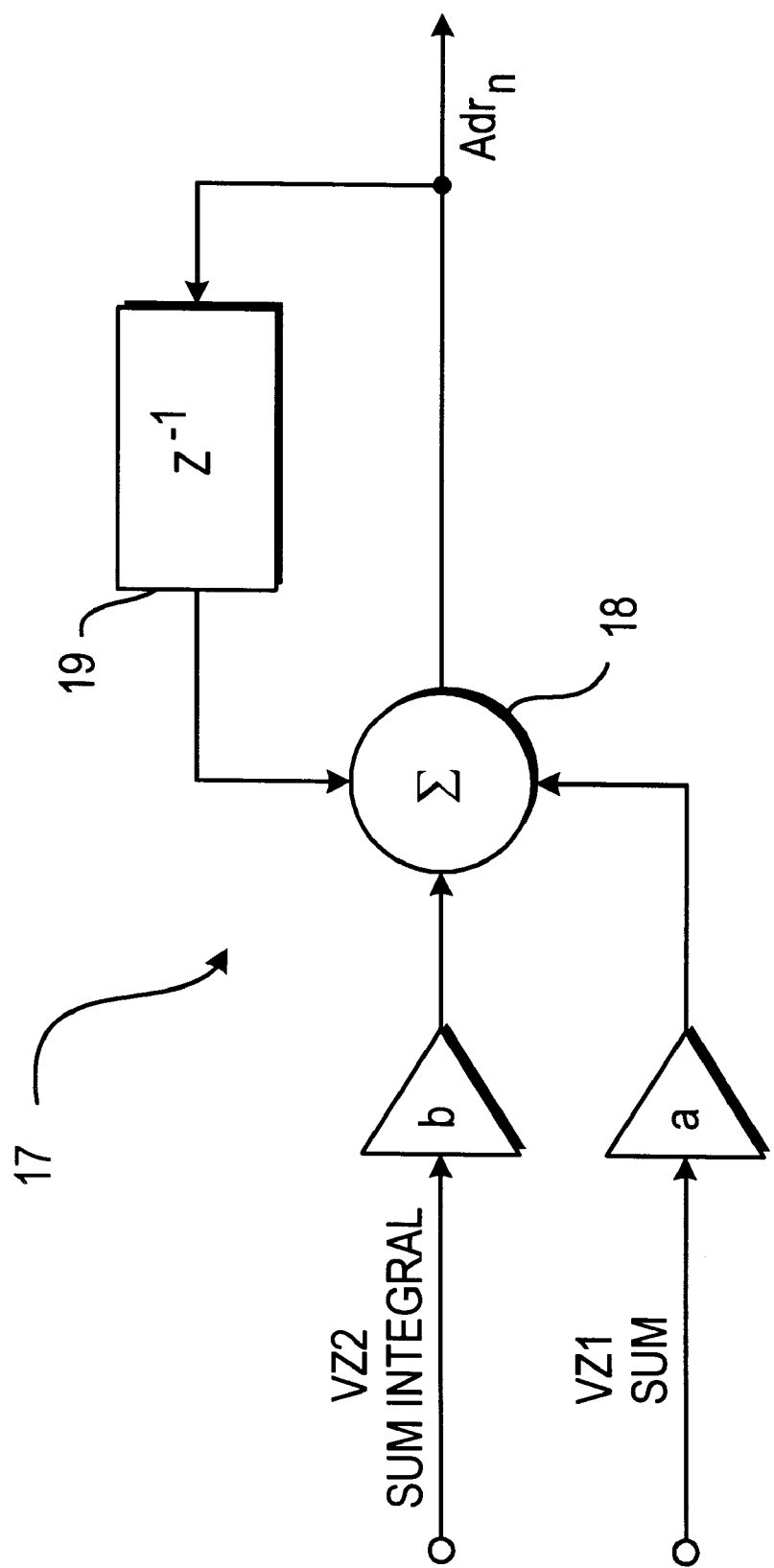
FIG. 2 is a block diagram of a sigma-delta modulator according to the invention.

A schematic block diagram of the address processor 17 is shown in FIG. 2. It computes the new addresses $Adr_n$ in which the ROM 10 acting as the sin/cos ROM according to equation (2)

$$Adr_n = Adr_{n-1} + a*VZ1 + b*VZ2, \tag{2}$$

in which $Adr_{n-1}$ is the address associated with the current estimated angle value $\alpha_s$. Since the address must be an integer, there are certain boundary conditions for the factors a,b. For example the factors a,b can be integer or whole numbers, or 12*a and 2*b can take odd whole values. In the present embodiment a=0.5 and b=1.5 were selected. The address word length can be 11 bits greater than the address length of the ROM 10, which amounts to 9-bits for example. Thus it is possible to provide an angular range of greater than $2*\pi$ incrementally. When the complete allowed angular range of $2*\pi$ is used, the word length of the address Adr should be increased about at least one bit relative to the word length of the ROM 10. In other cases no averaging or low pass filtering of the address Adr is possible since one must take into account that since the angles 0 and $2*\pi$ are neighboring, the average values of both values amounts to $\pi$.

Figure 3:
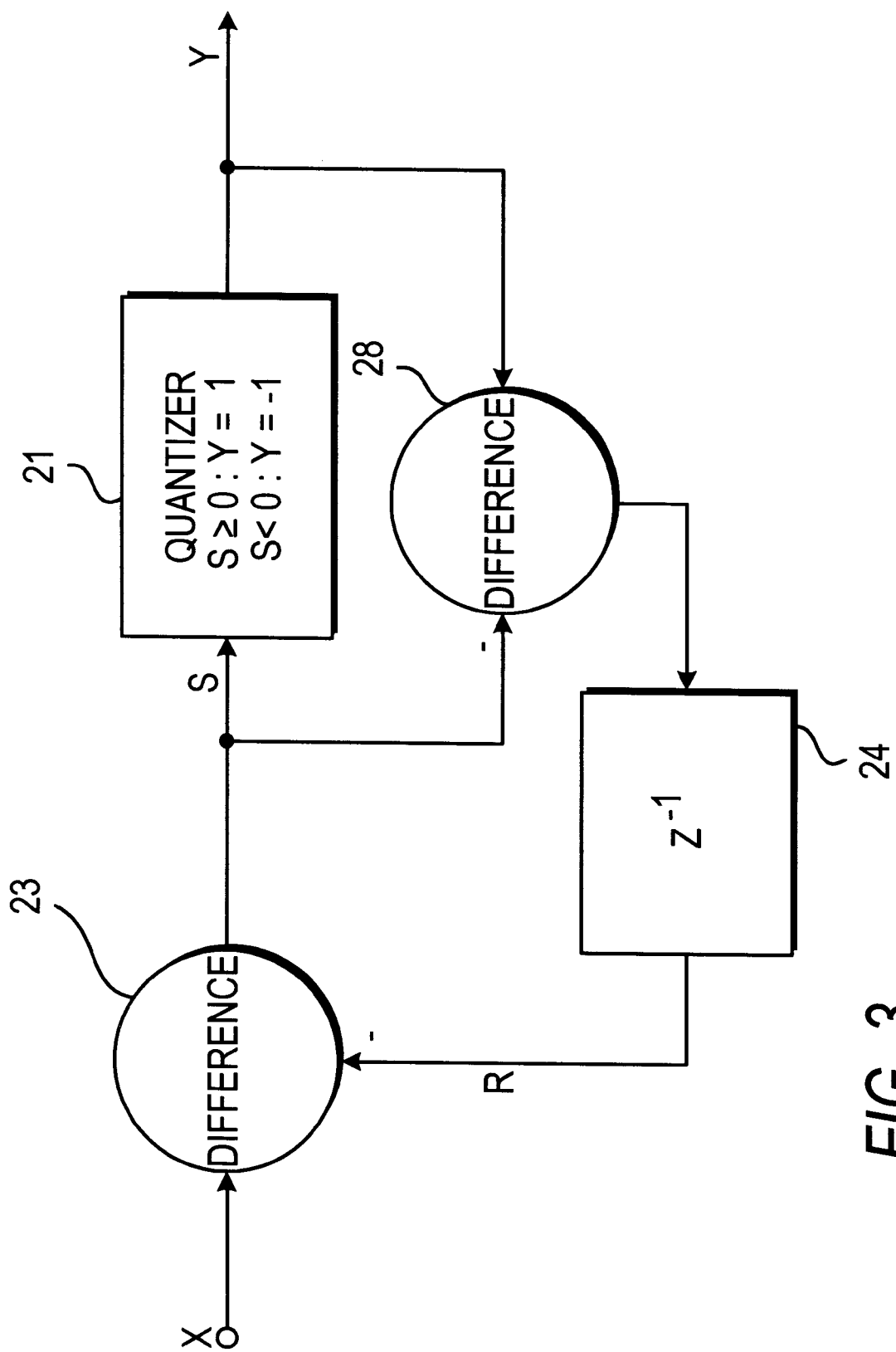
FIG. 3 is a block diagram of an address computer used in the arrangement according to the invention.

The circuitry necessary to perform the calculation according to equation (2) is shown in FIG. 3. The signals VZ1 and VZ2 are multiplied by the factors a and b and fed to the summing element 18. The value $Adr_{n-1}$, i.e. the address determined during the immediate prior summation, is input to the summing element 18 after a time delay by means of a time delay element 19. The address $Adr_n$ associated with the new estimated angle value $\alpha_s$ is subsequently supplied to the ROM 10 as an input signal.

The respective values $-v*\sin(\alpha_s)$ and $\cos(\alpha_s)$ are then determined in ROM 10 from the new address $Adr_n$ and, as mentioned above, fed to the sigma-delta modulators 8 as input signals. The amplitude correction of about a factor v is performed by a sine table provided in ROM 10 with a plurality of discrete amplitudes (e.g. 0.8 to 1.25 in 32 steps) and the equalization of v occurs by digital selection of the suitable table entry. Alternatively an explicit digital multiplication of the sine value with the factor $-v$ can occur (for example by means of the already mentioned component 30). The sigma-delta modulators 8, the sign reversing means 6, the adder 12, the comparators 14,16, the integrator 15, the address computer 17 and the ROM 17 together form a control loop for determining the angle $\alpha$.

During the occurring estimating process using the estimated value $\alpha_s$ for the angle a to be determined (for example on attaining a predetermined accuracy or precision) the appropriate address value Adr is input to an additional digital high-frequency timed sigma-delta modulator 20, which acts as a D/A converter in the present case. After low-pass filtering an analog output voltage $U\alpha$ is available which is proportional to the measured angle $\alpha_s$ to be determined. Alternatively a digital low pass filtering of the address can be performed after reducing the scanning rate (decimation), whereby a digital output of the angle with reduced scan rate is possible.

A sigma-delta modulator that can be used in the apparatus according to the invention is shown in a block diagram in FIG. 3. This embodiment of a sigma-delta modulator is of first order, which for example is usable for the above-described conversion of a value present in digital form into a sequence of discrete values ±1. The sigma-delta modulator shown in FIG. 3 receives a value X, for example a 16 bit word, in digital form as input signal. Subsequently the difference between this value X and a control parameter R is determined in the difference element 23 and is input to a quantizer 21 as a sum signal S. It produces an output signal Y=+1 for the case that $S \geq 0$, and an output signal Y=-1 for the case in which S<0. A control loop for compensating quantization errors is provided including an element 28 for determining the difference between S and Y and a delay element 24, which feeds this difference value to the difference element 23 as correction factor R with a time delay.

The symbol * is used in the claims below and the disclosure above to indicate multiplication.

The disclosure in German Patent Application 198 19 069.7 of Apr. 29, 1998 is incorporated here by reference. This German Patent Application describes the invention described hereinabove and claimed in the claims appended hereinbelow and provides the basis for a claim of priority for the instant invention under 35 U.S.C. 119.

While the invention has been illustrated and described as embodied in a circuit arrangement for arithmetic combination of an analog signal with a digital value and method and circuit arrangement for determination of an angle, it is not intended to be limited to the details shown, since various modifications and changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and is set forth in the following appended claims.

I claim:

1. A circuit arrangement for arithmetic combination of analog signals (C,S) with respective digital values (Ss, Cs), said circuit arrangement comprising respective controllable sign reversing means (6) for switching said analog signals (C,S) with changed or unchanged sign, each of said sign reversing means (6) having a control input; and respective sigma-delta modulators (8) for controlling said sign reversing means (6), said sigma-delta modulators (8) including means for producing a sequence of discrete output signals from said respective digital values (Ss, Cs), wherein said discrete output signals are +1 or -1 respectively according to said digital values (Ss,Cs) and said discrete output signals of the respective sigma-delta modulators (8) are input to the control inputs of the respective sign reversing means (6);

whereby a value of +1 at one of said control inputs causes a switching of said analog signal (C,S) input to said sign reversing means having said one of said control inputs with unchanged sign and a value of -1 at one of said control inputs causes a switching of said analog signal (C,S) input to said sign reversing means having said one of said control inputs with changed sign, or vice versa, so that the time average values of respective output signals of said sign reversing means corresponds to the desired arithmetic combination of the analog signal (C) and the digital value (Ss) and of the analog signal (S) and digital value (Cs) respectively.

2. The circuit arrangement for said arithmetic combination as defined in claim 1, wherein said arithmetic combination consists of multiplication.

3. The circuit arrangement for said arithmetic combination as defined in claim 1, wherein said analog signals are voltage signals.

4. A method for determining an angle ($\alpha$) from analog signals (S, C) proportional to the sine and cosine of said angle ($\alpha$), said method including the steps of:

a) multiplying one (S) of said analog signals with one digital value (Cs) to obtain a first product value (S*Cs), said digital value (Cs) being proportional to the cosine of an estimated angle value ($\alpha_s$) for said angle ($\alpha$) to be determined;

b) multiplying another (C) of said analog signals with another digital value (Ss) to obtain a second product value (C*Ss), said another digital value (Ss) being proportional to the sine of said estimated angle value ($\alpha_s$) of the angle ($\alpha$) to be determined;

c) adding the first and second product values (S*cs; C*Ss) to obtain a sum value (Su);

d) equalizing proportionality factors for said one and/or said another digital value (Ss; Cs) so that said sum value (Su) formed is proportional to sin ($\alpha - \alpha_s$); and e) adjusting said sum value (Su) to zero so that said estimated angle value ($\alpha_s$) corresponds to said angle ($\alpha$) to be determined.

5. The method as defined in claim 4, wherein the adjusting of the sum value (Su) to zero takes place according to the following steps:

a) determining a sign (VZ1) of the sum value (Su) and a sign (VZ2) of an integral of the sum value (Su) over a predetermined time interval;

b) determining a modified estimated angle value ($\alpha_s$) for said angle ($\alpha$) to be determined from a current value of said estimated angle value ((is) and said signs (VZ1, VZ2) determined in step a); and c) repeating said determining of said signs and said determining of said modified estimated angle value until a value of said modified estimated angle value ($\alpha_s$) obtained thereby has a predetermined precision.

6. The method as defined in claim 5, wherein said modified estimated angle value ($\alpha_s$) is determined by means of an address computer according to the equation (2):

$$\text{Adr}_n = \text{Adr}_{n-1} + a^*VZ1 + b^*VZ2, \tag{2}$$

wherein $\text{Adr}_n$ corresponds to the address of the modified estimated angle value ($\alpha_s$) in a memory associated with the address computer and said addresses (Adr) are representable in the form $\text{Adr} = \alpha_s/2/\pi^*N$, wherein N is the number of the addresses or table entries per sine period and a,b are selected so that said address (Adr) is a whole number.

7. The method as defined in claim 6, wherein said memory is a ROM (10) acting as sin/cos-ROM.

8. The method as defined in claim 6, wherein said address (Adr) associated with said angle ($\alpha$) to be determined is input to a digital sigma-delta modulator (20) operating as a digital/analog converter to produce an analog output signal and said analog output signal is low-pass filtered to obtain a filtered analog output signal corresponding to said angle ($\alpha$) to be determined.

9. A method as defined in claim 6, wherein said address (Adr) associated with said angle ($\alpha$) to be determined is digitally low-pass filtered to obtain a filtered analog output signal corresponding to said angle ($\alpha$) to be determined.

10. A circuit arrangement for determining an angle ($\alpha$) from analog signals (C,S) proportional to the sine and cosine of the angle ($\alpha$) to be determined, said circuit arrangement comprising means for multiplying one (S) of said analog signals with one digital value (Cs) for obtaining a first product value (S*Cs), said digital value (Cs) being proportional to the cosine of an estimated angle value ($\alpha_s$) for said angle ($\alpha$) to be determined;

means for multiplying another (C) of said analog signals with another digital value (Ss) to obtain a second product value (C*Ss), said another digital value (Ss) being proportional to the sine of said estimated angle value ($\alpha_s$) for the angle ($\alpha$) to be determined;

means for adding the first and second product values (S*Cs; C*Ss) to obtain a sum value (Su);

means for equalizing proportionality factors for said one and/or said another value (Ss; Cs) so that said sum value (Su) formed is proportional to sin ($\alpha - \alpha_s$); and means for adjusting said sum value (Su) to zero so that said estimated angle value ($\alpha_s$) corresponds to said angle ($\alpha$) to be determined.

11. The circuit arrangement for determining an angle ($\alpha$) as defined in claim 10, further comprising:

means for determining a sign (VZ1) of said sum value (Su) and a sign (VZ2) of an integral of said sum value (Su) over a predetermined time interval;

means for determining a modified estimated angle value ($\alpha_s$) of the angle $\alpha$ to be determined from a current value of said estimated angle value ($\alpha_s$) and said signs (VZ1,VZ2) determined in step a); and means for repeating said determining of said signs and said determining of said modified estimated angle value until a value of said modified estimated angle value ($\alpha_s$) obtained thereby has a predetermined precision.

12. The circuit arrangement for determining an angle ($\alpha$) as defined in claim 11, further comprising an address computer including means for calculating said modified estimated angle value ($\alpha_s$) according to the equation (2):

$$\text{Adr}_n = \text{Adr}_{n-1} + a^*VZ1 + b^*VZ2, \tag{2}$$

wherein $\text{Adr}_n$ corresponds to the address of the modified estimated angle value ($\alpha_s$) in a memory associated with the address computer and said addresses (Adr) are representable in the form $\text{Adr} = \alpha_s/2/\pi^*N$, wherein N is the number of the addresses or table entries per sine period and a,b are selected so that said address (Adr) is a whole number.

13. The circuit arrangement for determining an angle ($\alpha$) as defined in claim 12, further comprising a sigma-delta modulator (20) operating as a digital/analog converter to which an address (Adr) associated with said angle ($\alpha$) to be determined is input to produce an analog output signal and low-pass filter means for low-pass filtering said analog output signal to obtain a filtered analog output signal corresponding to said angle ($\alpha$) to be determined.

14. The circuit arrangement for determining an angle ($\alpha$) as defined in claim 12, wherein said memory is a ROM (10) acting as sin/cos-ROM.

* * * * *